United States Patent
Lee

(10) Patent No.: US 6,461,960 B2
(45) Date of Patent: Oct. 8, 2002

(54) METHOD OF MANUFACTURING A SEMICONDUCTOR DEVICE

(75) Inventor: In Haeng Lee, Kyungki-Do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/875,624

(22) Filed: Jun. 6, 2001

(65) Prior Publication Data

US 2002/0001948 A1 Jan. 3, 2002

(30) Foreign Application Priority Data

Jun. 28, 2000 (KR) ........................................ 2000-36059

(51) Int. Cl.[7] .............................................. H01L 21/44
(52) U.S. Cl. ....................... 438/683; 438/655; 438/685; 438/649
(58) Field of Search ................... 438/683, 685, 438/629, 648, 649, 655

(56) References Cited

U.S. PATENT DOCUMENTS

| | | | | |
|---|---|---|---|---|
| 5,950,083 A | * | 9/1910 | Inoue et al. ................. | 438/233 |
| 5,972,790 A | * | 10/1999 | Arena et al. ................. | 438/649 |
| 5,976,976 A | * | 11/1999 | Doan et al. ................... | 438/683 |
| 6,004,872 A | * | 12/1999 | Tezuka et al. ............... | 438/592 |
| 6,140,230 A | * | 10/2000 | Li ............................... | 438/653 |
| 6,204,170 B1 | * | 3/2001 | Taguwa ....................... | 438/649 |
| 6,291,346 B1 | * | 9/2001 | Tai ............................... | 438/683 |

* cited by examiner

Primary Examiner—Trung Dang
(74) Attorney, Agent, or Firm—Marshall, Gerstein & Borun

(57) ABSTRACT

A method of manufacturing a semiconductor device in a salicide process to lower a contact resistance between a junction and a metal wiring, wherein a $TiSi_2$ layer is formed on the junction at the same time when Ti is deposited by means of a plasma vapor deposition method using $TiCl_4$ gas and $H_2$ gas. Therefore, the method can simplify the process and reduce the amount of consumption of silicon atoms in the junction, compared to the conventional salicide process by which a $TiSi_2$ layer is formed by annealing process after Ti is deposited, thus realizing a stable leakage current characteristic.

8 Claims, 1 Drawing Sheet

METHOD OF MANUFACTURING A SEMICONDUCTOR DEVICE

BACKGROUND OF THE INVENTION

1. Field of the Invention

The invention relates generally to a method of manufacturing a semiconductor device. More particularly, the invention relates to a method of manufacturing a semiconductor device, which can simplify the process and reduce the amount of consumption of silicon atoms, by forming a $TiSi_2$ layer by a salicide process that is used to lower a contact resistance between a junction and metal wiring.

2. Description of the Prior Art

Generally, as a semiconductor device is more highly integrated, miniaturized and more highly functional, schemes to reduce a contact resistance between a metal wiring and a junction are studied. As one option to reduce the contact resistance, there is a method in which a silicide layer is formed on the entire surface of the junction, which is performed by a salicide process. A conventional salicide process involves two steps: a process of depositing Ti and a subsequent annealing process. By the annealing process, Ti atoms and Si atoms are reacted, so that the surface of the junction is salicided to form a $TiSi_2$ layer. Ti used in the reaction is deposited by a physical vapor deposition (PVD) method and the annealing process employs a rapid thermal process (RTP) in order to minimize consumption of Si atoms in the junction.

Though the contact resistance can be lowered since the $TiSi_2$ layer is formed on the surface of the junction, the function of the junction is lowered due to consumption of Si atoms accompanied by the process of forming the $TiSi_2$ layer. That is, as Ti atoms and Si atoms are reacted to form the $TiSi_2$ layer, consumption of Si atoms is inevitable. As the number of Si atoms (which is more than about 2.3 times the number of Ti atoms in forming the $TiSi_2$ layer) increases, the amount of consumption of Si atoms inevitably increases. In order to minimize consumption of the Si atoms within the junction, the deposition thickness of Ti must be as thin as possible. In this case, however, a low voltage necessary for driving the device may not be obtained. Therefore, in order to solve this problem, if the thickness increases, the leakage current characteristic is degraded due to consumption of Si atoms.

These conflicting dynamics result in a limit to the manufacture of an ultra-high integration semiconductor device requiring a shallow junction. Therefore, there is a need to minimize consumption of Si atoms within the junction while the deposition thickness of Ti is increased.

SUMMARY OF THE INVENTION

A method of manufacturing a semiconductor device includes the steps of providing a semiconductor substrate for forming a $TiSi_2$ layer, and substantially simultaneously forming the $TiSi_2$ layer and depositing Ti by a plasma deposition vapor method using $TiCl_4$ gas and $H_2$ gas.

A method of manufacturing a semiconductor device according to another embodiment of the disclosure is characterized in that it includes the steps of providing a semiconductor substrate in which a device separation film, a gate and a junction are formed; forming a mask insulating film on the gate and forming a gate spacer at both sidewalls of the gate; forming a silicon layer on an exposed surface of the junction; forming a $TiSi_2$ layer on the silicon layer and substantially simultaneously depositing Ti by a plasma deposition vapor method using $TiCl_4$ gas and $H_2$ gas; and removing the Ti layer that is unreacted after the $TiSi_2$ layer is formed.

In the above, the silicon layer is preferably formed by a selective epitaxial growth method using one of $SiH_4$, $SiH_2Cl_2$, $SiHCl_3$, and $SiCl_4$ as a reaction gas.

The $TiSi_2$ layer is formed under conditions wherein power is in the range of about 100 Watts to about 500 Watts, pressure is in the range of about 2 Torr to about 20 Torr, the temperature of the semiconductor substrate is in the range of about 400° C. to about 700° C., the $TiCl_4$ gas flow rate is about 10 mg/min to about 100 mg/min, and the $H_2$ gas flow rate is about 1000 sccm to about 3000 sccm.

DETAILED DESCRIPTION OF PREFERRED EMBODIMENTS

It is an objective of the disclosure to provide a method of manufacturing a semiconductor device by which consumption of Si atoms within a junction can be minimized while the deposition thickness of Ti is increased when a $TiSi_2$ layer is formed, thus lowering a contact resistance and improving a leakage current characteristic of the junction.

Another objective of the disclosure is to provide a method of manufacturing a semiconductor device by which a $TiSi_2$ layer is formed on the surface of a junction while Ti is deposited by a plasma vapor deposition method, using a $TiCl_4$ gas and a $H_2$ gas, thus improving productivity through simplification of the process.

The invention will be described in detail by way of a preferred embodiment with reference to the drawings.

Figure 1A:
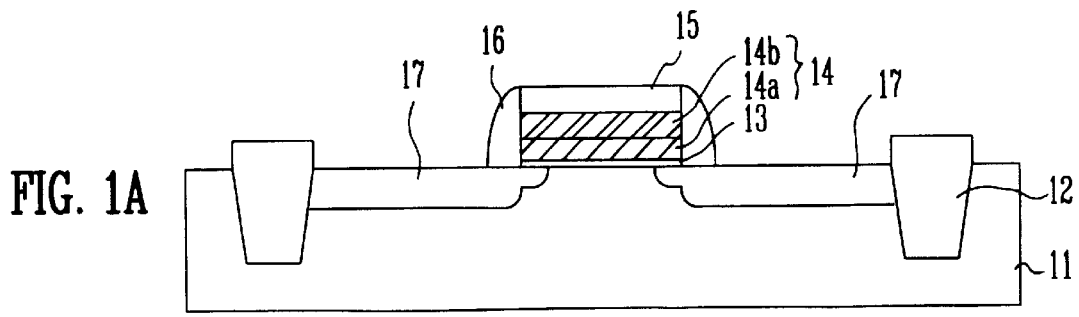
FIGS. 1A to 1D are cross-sectional views of a device for explaining a method of manufacturing a semiconductor device.

Referring to FIG. 1A, a device separation film 12 is formed on a semiconductor substrate 11 to define an active region. Then, a gate oxide film 13 is formed on a given portion of the semiconductor substrate 11 of an active region, and a gate 14 in which a polysilicon layer 14a and a metal layer 14b are stacked on the gate oxide film 13. Next, a mask insulating film 15 is formed on the gate 14 and a gate spacer 16 is formed at the sidewall of the gate 14. A junction 17 is formed in the semiconductor substrate 11 between the gate 14 and the device separation film 12.

In the foregoing, the device separation film 12 is usually formed using oxide, and the mask insulating film 15 and the gate spacer 16 are formed of oxide, nitride, a mixture thereof, or in a structure wherein those materials are stacked.

Figure 1B:
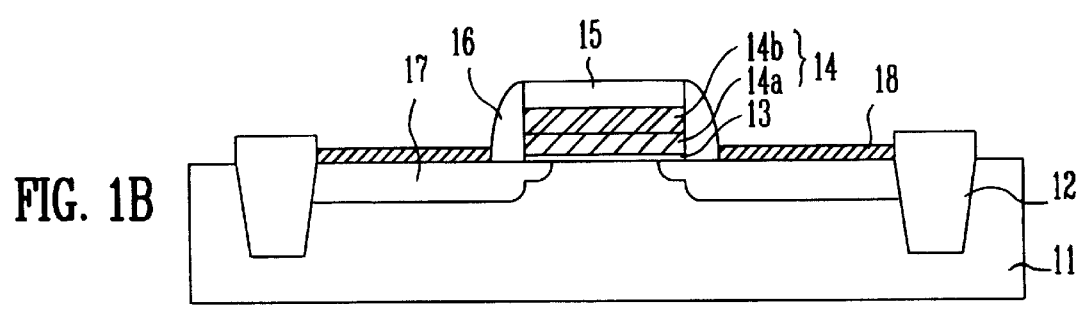

Referring to FIG. 1B, a silicon layer 18 is formed on the surface of the junction 17. Due to formation of the silicon layer 18, the junction 17 becomes an elevated source/drain (ESD) structure.

In the above, the silicon layer 18 is formed in such a manner that silicon is deposited on the entire structure in which the gate 14 is formed, and the silicon layer 18 is then patterned so that it remains only on the junction 17, or that silicon is grown on the exposed surface of the junction 17 by means of a selective epitaxial growth (SEG) method.

Where the silicon layer 18 is formed by a selective epitaxial growth method, at least one of $SiH_4$, $SiH_2Cl_2$, $SiHCl_3$, $SiCl_4$, and the like is preferably used as a reaction gas.

Figure 1C:
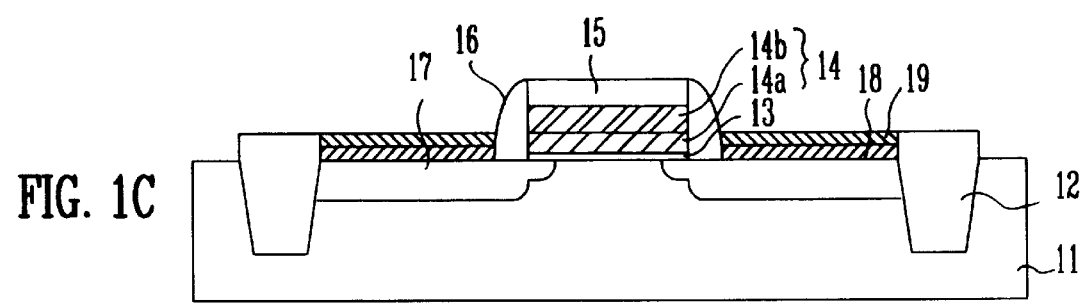

Referring to FIG. 1C, in order to lower a contact resistance of the junction 17 and a metal wiring to be formed later, Ti is deposited by means of a plasma vapor deposition (PECVD) method using a $TiCl_4$ gas and a $H_2$ gas to form a $TiSi_2$ layer 19 on the silicon layer 18. After the $TiSi_2$ layer 19 is formed, a Ti layer (not shown), which is unreacted, at the portion made of insulating materials such as the mask insulating film 15, the gate spacer 16, etc., is removed.

In the foregoing, the $TiSi_2$ layer 19 is formed on the silicon layer 18 since Ti atoms are reacted with Si atoms in the silicon layer 18 at the same time when Ti is deposited. Conditions for facilitating the reaction of Ti atoms with Si atoms are as follows: the power for plasma vapor deposition is in the range of about 100 Watts to about 500 Watts, the pressure is in the range of about 2 Torr to about 20 Torr, and the temperature of the semiconductor substrate 11 is in the range of about 400° C. to about 700° C. At this time, the $TiCl_4$ gas flows at a rate of about 10 mg/min to about 100 mg/min and the $H_2$ gas flows at a rate of about 1000 sccm to about 3000 sccm. In addition to these gases, an inert gas, Ar, flows at a rate of about 100 sccm to about 5000 sccm.

Meanwhile, after an unreacted Ti layer is removed, for the purpose of lowering resistivity of the $TiSi_2$ layer 19, an annealing process is performed at a temperature of about 700° C. to about 900° C. to change the phase of the $TiSi_2$ layer 19 into C54 phase.

Figure 1D:
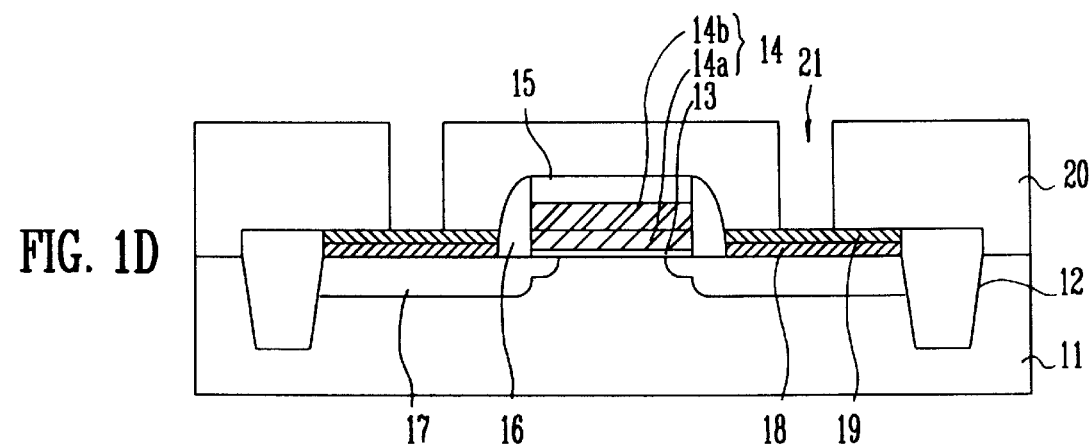

Referring to FIG. 1D, an interlayer insulating film 20 is formed on the entire structure including the $TiSi_2$ layer 19. Then, a portion of the interlayer insulating film 20 is removed so that a portion of the $TiSi_2$ layer 19 is exposed, thus forming a contact hole 21.

Thereafter, metal wiring (not shown), which is electrically connected to the junction 17, is formed on the interlayer insulating film 20 including the contact hole 21 by deposition and patterning of a conductive material, such as a metal.

The method prevents consumption of Si atoms within the junction 17 when the $TiSi_2$ layer 19 is formed, by forming the $TiSi_2$ layer 19 on the surface of the junction 17 simultaneously with deposition of Ti by means of a plasma vapor deposition (PECVD) method using $TiCl_4$ gas and $H_2$ gas, and forming the silicon layer 18 acting as a sacrificial film against consumption of Si atoms within the junction 17 before the $TiSi_2$ layer 19 is formed.

The method may be applied to all the processes of manufacturing a semiconductor device, requiring a process of forming $TiSi_2$.

Another embodiment to which the method may be applied, includes a method of forming the $TiSi_2$ layer 19 on the surface of the junction 17 simultaneously with deposition of Ti, by means of plasma vapor deposition method using $TiCl_4$ gas and $H_2$ gas, as is explained in FIG. 1C, without the process of forming the silicon layer 18 explained in FIG. 1B. If the $TiSi_2$ layer 19 is formed by this method, consumption of Si atoms within the junction 17 may be greater than the above embodiment of the method. However, it can simplify the process compared to the conventional method, since the $TiSi_2$ layer 19 can be formed simultaneously with deposition of Ti.

Another embodiment to which the method may be applied, includes a method by which the gate 14 explained in FIG. 1A is formed only of polysilicon, the surface of the gate is exposed, and the $TiSi_2$ layer 19 is formed on the surface of the polysilicon gate 14 as well as the surface of the junction 17, at the same time when Ti is deposited by means of a plasma vapor deposition method using $TiCl_4$ gas and $H_2$ gas explained in FIG. 1C. If the $TiSi_2$ layer 19 is formed by this method, consumption of Si atoms within the junction 17 may be greater than the foregoing embodiment of the method. However, it can simplify the process compared to the conventional method, since the $TiSi_2$ layer 19 can be formed simultaneously with deposition of Ti.

Another embodiment to which the method may be applied, includes a method by which the gate 14 explained in FIG. 1A is formed only of polysilicon, the surface of the gate is exposed, the silicon layer 18 explained in FIG. 1B is grown by selective epitaxial growth to form it on the polysilicon gate 14 as well as the junction 17, and the $TiSi_2$ layer 19 is formed on the silicon layer 18 on the polysilicon gate 14 as well as on silicon layer 18 on the junction 17, respectively, at the same time when Ti is deposited by means of a plasma vapor deposition method using $TiCl_4$ gas and $H_2$ gas explained in FIG. 1C. If the $TiSi_2$ layer 19 is formed by this method, as in the above embodiment of the method, consumption of Si atoms within the junction 17 can be prevented by the silicon layer 18. Also, additional process of forming the metal layer 14b for lowering the resistance of the gate 14 is not required, and the process can be also simplified compared to the conventional method, since the $TiSi_2$ layer 19 can be formed simultaneously with deposition of Ti.

Another embodiment to which the method may be applied, includes forming a contact hole 21 through which a portion of the junction 17 is exposed, before the $TiSi_2$ forming process is performed unlike the process steps according to the embodiment explained by reference to FIGS. 1A to 1D, and forming a barrier metal layer when a metal wiring (not shown).

As mentioned above, the method forms a $TiSi_2$ layer on the surface of the junction at the same time when Ti is deposited by means of a plasma vapor deposition (PECVD) method using $TiCl_4$ gas and $H_2$ gas, in a salicide process used to lower a contact resistance of a junction and a metal wiring. Therefore, the method can simplify the process compared to a conventional salicide process by which a $TiSi_2$ layer is formed by annealing process after Ti is deposited. Also, the method can improve an electrical characteristic of a semiconductor device such as a leakage current characteristic, a contact resistance characteristic, etc., since it can reduce the amount of silicon atoms consumption in a junction, thus realizing an ultra-high integration of a device.

The method has been described with reference to a particular embodiment in connection with a particular application. Those having ordinary skill in the art and access to the teachings of the disclosure will recognize additional modifications and applications within the scope thereof.

It is therefore intended by the appended claims to cover any and all such applications, modifications, and embodiments within the scope of the invention.

What is claimed is:

1. A method of manufacturing a semiconductor device, comprising the steps of:

providing a semiconductor substrate defining a device separation film, a gate having two sidewalls, and a junction having an exposed surface;

forming a mask insulating film on said gate and forming a gate spacer at both sidewalls of said gate;

forming a silicon layer on the exposed surface of said junction;

forming a $TiSi_2$ layer on said silicon layer and substantially simultaneously depositing Ti on the silicon layer by a plasma vapor deposition method using $TiCl_4$ gas and $H_2$ gas; and removing any unreacted Ti layer after said $TiSi_2$ layer is formed.

2. The method of claim 1, comprising the step of forming said silicon layer by a selective epitaxial growth method.

3. The method of claim 1, comprising the step of using at least one of $SiH_4$, $SiH_2Cl_2$, $SiHCl_3$, and $SiCl_4$ as a reaction gas in said selective epitaxial growth method.

4. The method of claim 1, comprising the step of forming said $TiSi_2$ layer under a power of about 100 Watts to about 500 Watts, a pressure in the range of about 2 Torr to about 20 Torr, and a temperature of the semiconductor substrate is in the range of about 400° C. to about 700° C.

5. The method of claim 1, comprising the step of flowing the $TiCl_4$ gas at a rate of about 10 mg/min to about 100 mg/min and flowing the $H_2$ gas at a rate of about 1000 sccm to about 3000 sccm, to form said $TiSi_2$ layer.

6. The method of claim 1, wherein said plasma vapor deposition method employs Ar as an inert gas at a flow rate of about 100 sccm to about 5000 sccm, in addition to said $TiCl_4$ and $H_2$ gases used to form said $TiSi_2$ layer.

7. The method of claim 6, further including a step of annealing said $TiSi_2$ layer after removing the unreacted Ti layer.

8. The method of claim 7, comprising the step of performing the annealing at a temperature of about 700° C. to about 900° C. to change the phase of said $TiSi_2$ layer into C54 phase.

* * * * *